United States Patent [19]

Moon

[11] Patent Number: 4,612,571
[45] Date of Patent: Sep. 16, 1986

[54] CONSTANT Z BANDSWITCHED INPUT FILTER

[75] Inventor: Frederick H. Moon, Mt. Prospect, Ill.

[73] Assignee: Zenith Electronics Corporation, Glenview, Ill.

[21] Appl. No.: 679,654

[22] Filed: Dec. 7, 1984

[51] Int. Cl.$^4$ .......................... H04N 7/10; H03H 7/10
[52] U.S. Cl. ...................... 358/86; 333/174; 333/32; 455/191
[58] Field of Search ............. 358/86; 455/3, 6, 191, 455/248; 333/32, 174

[56] References Cited

U.S. PATENT DOCUMENTS

| | | | |
|---|---|---|---|
| 3,336,539 | 8/1967 | Kwartiroff et al. | 333/32 |
| 4,247,953 | 1/1981 | Shinagawa et al. | 455/191 |
| 4,542,300 | 9/1985 | Nagatomi | 455/3 X |
| 4,571,560 | 2/1986 | Dobrovolny | 333/174 |

FOREIGN PATENT DOCUMENTS 58-105633  6/1983  Japan ..................... 358/86

*Primary Examiner*—Keith E. George

[57] ABSTRACT

A constant impedance (Z) bandswitched input filter for use in a wideband signal receiver includes a low pass filter, a high pass filter and a bandpass filter for reducing intermodulation distortion as well as for providing a flat input impedance characteristic. The bandpass filter resonates at the crossover frequency between the low and high pass filters for minimizing insertion loss while maintaining a constant termination impedance across the entire input signal bandwidth to reduce the input standing wave ratio (VSWR). Switching means are provided for coupling the high and low pass filters as well as the bandpass filter in circuit depending upon the frequency band tuned to. The constant Z bandswitched input filter is particularly adapted for use in a wide band cable television (CATV) system for substantially reducing intermodulation distortion and signal reflections arising from impedance mismatches, but has application in any cable operated multichannel communications system.

9 Claims, 2 Drawing Figures

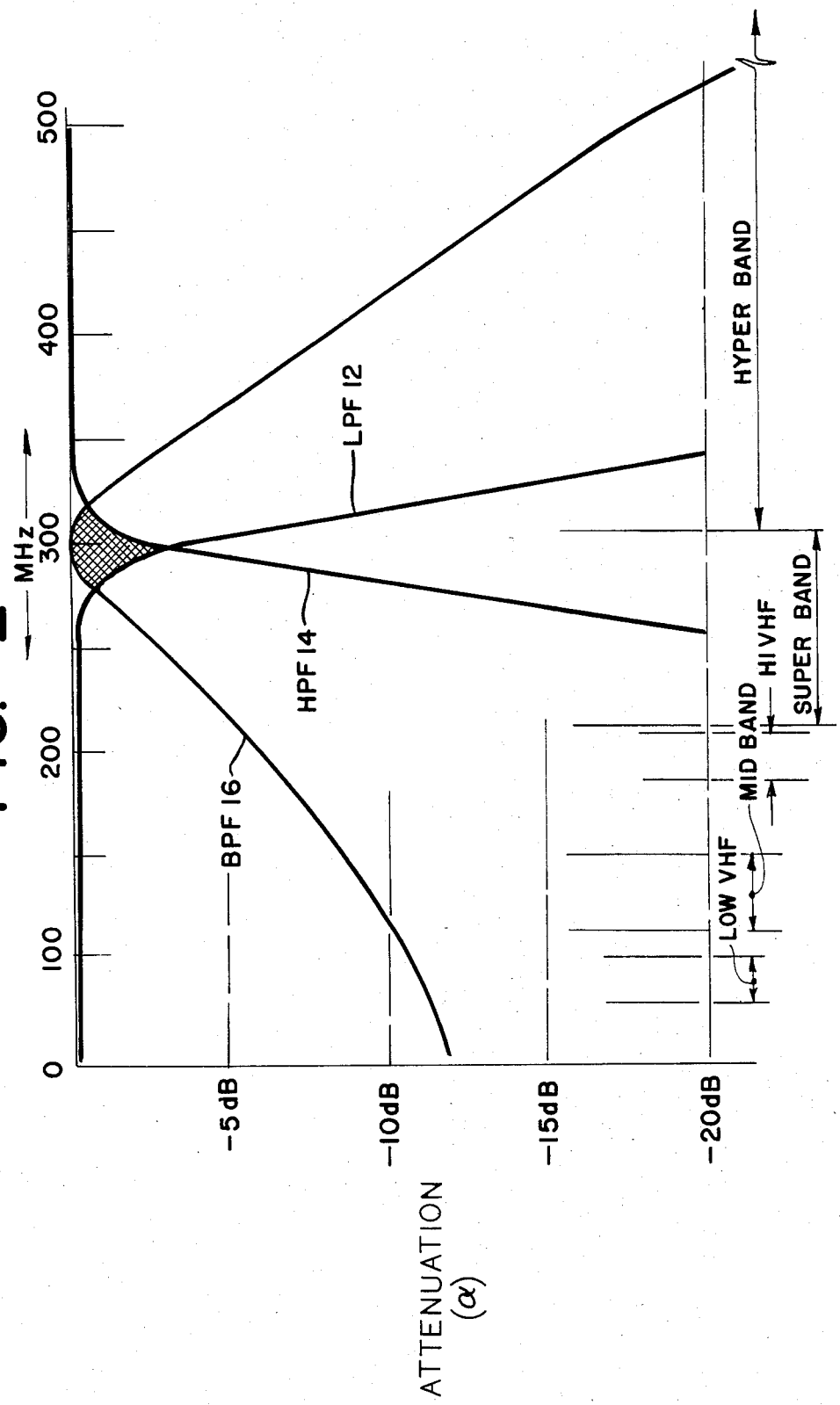

CONSTANT Z BANDSWITCHED INPUT FILTER

BACKGROUND OF THE INVENTION

This invention relates generally to wideband cable television communications receivers having bandswitched input signal filters to reduce cross-modulation, intermodulation and other nonlinear distortions and particularly concerns techniques for reducing transmitted signal reflections and for preventing spurious signals emanating from such receivers from interfering with other receivers connected in the same cable network.

In a cable television (CATV) system, a large number of television channel signals are transmitted simultaneously from a headend to many subscribers via a cable network. The large number of television channel signals transmitted on such cable networks can result in degraded signal reception due to various modulation distortions such as cross-modulation, intermodulation and other nonlinear distortions. In addition, the increased number of interference signals emanating from each receiver such as reflections of the transmitted signal itself and spurious signals generated in the various receivers further degrades signal reception in the other receivers connected in the same cable network.

When processing two or more signals through nonlinear circuit devices such as typically found in communications receivers, various intermodulation distortions are produced which result in spurious beat products. In a CATV system, where a large number of evenly spaced channel signals are processed, these beat products tend to stack or accumulate. In particular, the third order intermodulation beat products thus accumulated are manifested as background noise in the reproduced video image. Since all the channel frequencies have some random deviation from the exact, evenly spaced channel frequencies, these distortion products are not exactly at the desired channel carrier frequency, but rather are clustered around the received channel carrier frequency, and furthermore they accumulate in terms of power as in the case of noise rather than in terms of voltage.

The other predominant intermodulation distortion is caused by second order intermodulation products which comprise either the sum or difference of two interfering channel signals. Second order intermodulation distortion manifests itself as a spurious beat in the reproduced video image which is more disturbing than the additional background noise as in the case of third order intermodulation distortions.

An equally severe limitation in extended bandwidth CATV reception results from interference signals emanating from each receiver. These interfering signal emanations include reflections of the transmitted signals giving rise to "ghost" images in other receivers connected in the cable network and other spurious signals emanating from the receivers of which the so-called "back talk" signals are the most serious. The latter are the product of the incoming signals the the receiver's first voltage controlled local oscillator (VCO) and fall within the reception frequency bandwidth causing intermodulation interference, or "beats", in the other receivers connected in the cable network.

For receivers used in earlier, narrower bandwidth CATV systems, the conventional circuits provided adequate dynamic range and the modulation distortions were held to a relatively low level. Also, due to the narrower bandwidth, the "back talk" fell outside of the CATV system bandwidth and caused no problem. There was thus no need to provide for selective filtering of incoming signals and the high input return loss over the entire frequency bandwidth did not present a problem in minimizing input refelections so as to prevent "ghost" problems in other receivers connected in the cable network.

For receivers designated for use in extended bandwidth CATV systems, an attempt has been made to lower the intermodulation distortions and the "back talk" interference by using a tunable lowpass filter. However, this technique still results in noticeable modulation distortions and "ghosts" in the signals transmitted in the cable network. Still another attempt to alleviate the foregoing problems is disclosed in copending application Ser. No. 544,947, entitled "Low Noise CATV Converter", filed in the name of the present inventor, which issued as U.S. Pat. No. 4,520,507 on May 28, 1985. In this system, a wideband RF amplifier and a PIN attenuator are provided to increase the dynamic range of the tuner used in the CATV receiver. This approach results in a substantially improved signal-to-noise ratio for low-level signals and a reduction in the modulation distortion of high level signals by limiting the maximum signal level applied to the first mixer stage of the receiver which is the primary source of such modulation distortion. However, a compromise is made in this approach due to the extemely tapered signal level condition encountered resulting in limitations in dealing with the composite second order intermodulations in such tapered signal level conditions.

The present invention is intended to overcome the aforementioned limitations of the prior art by providing a constant impedance bandswitched input filter for a signal receiver or converter coupled to an input cable in a wideband CATV system, wherein the front end of the receiver is impedance-matched over the entire bandwidth of the CATV system for reducing signal distortion and minimizing interference signals emanating from the various receivers in the cable network.

OBJECTS OF THE INVENTION

Accordingly, it is an object of the present invention to provide an improved signal receiver or converter in a multi-channel cable communication system.

It is another object of the present invention to provide an input filter for a wideband multi-channel cable communications receiver which provides substantial reduction of cross-modulation, intermodulation and other nonlinear distortions and which also reduces interference signals emanating from the receiver.

A still further object of the present invention is to provide for use in a cable communications network a receiver with a high input return loss over the entire frequency band and which minimizes the reflection of received signals back into the cable network.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment and related subjects taken in conjunction with the accompanying drawings in which:

FIG. 2 graphically illustrates the frequency selectively characteristics of the constant impedance bandswitched input filter of FIG. 1.

DETAILED DESCRIPTION OF THE PREFERRED EMBODIMENT

Figure 1:
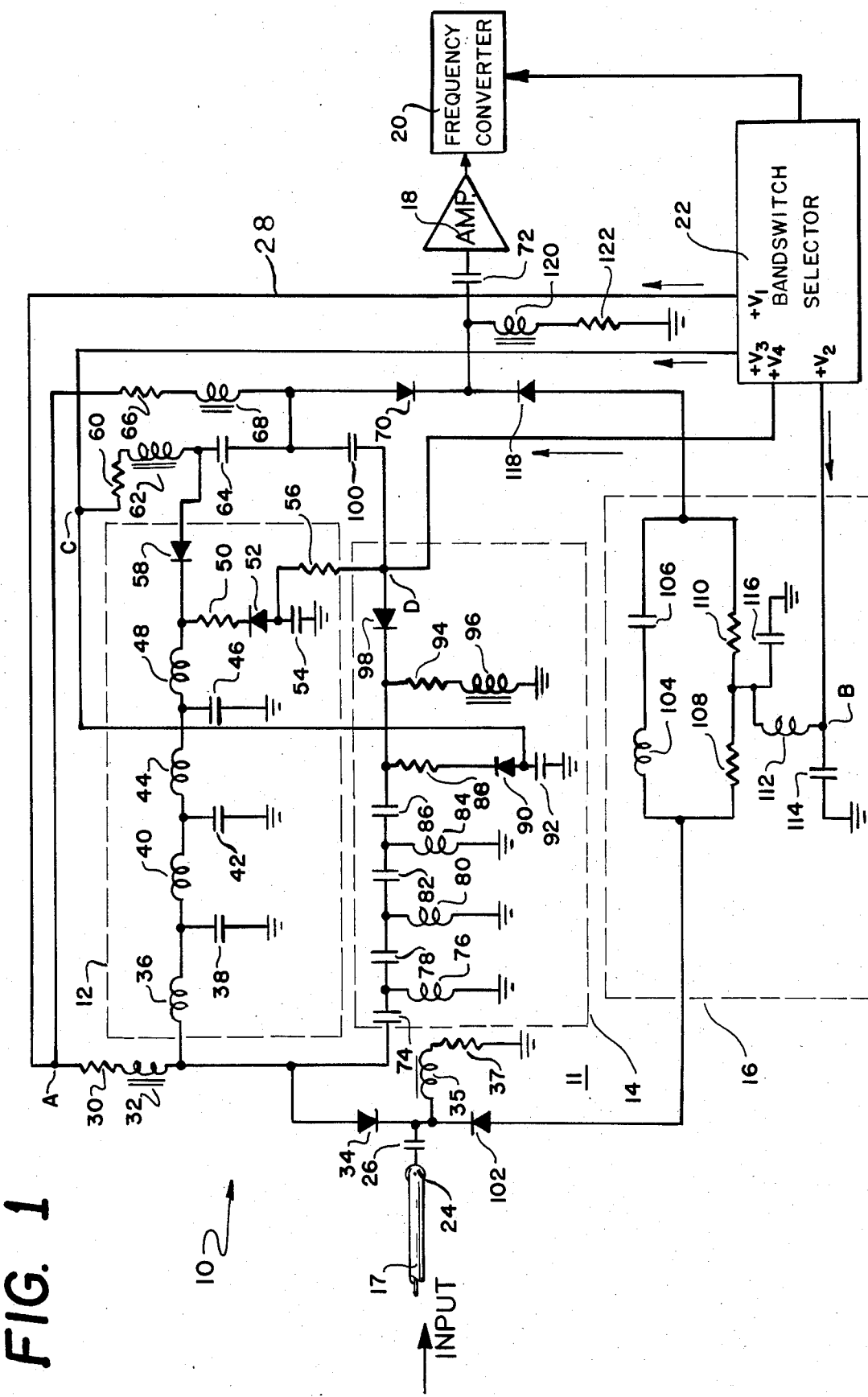
FIG. 1 is a combined schematic and block diagram of a constant impedance bandswitched input filter particularly adapted for use in a CATV system in accordance with the principles of the present invention.

Referring to FIG. 1, there is shown in schematic and block diagram form a constant impedance bandswitched input filter 11 for use in the front end of a cable communications receiver 10 in accordance with the present invention. Although the constant impedance bandswitched input filter 11 of the present invention is particularly adapted for use in the front end of a cable television (CATV) converter or receiver, the principles of the present invention are not limited to this environment and are applicable to the front end of any wideband, multi-channel communications receiver, converter, or other RF signal processing apparatus.

As seen in FIG. 1, the basic building blocks of the constant impedance bandswitched input filter 11 comprise a high-pass/low-pass diplexer filter and a bridge T bandpass filter connected in such a manner that all signals for the pass bands are passed to an amplifier while the signals for the rejection bands are essentially absorbed in the resistive loads of the diplexer circuit and the two resistors of the bridge T bandpass filter in eliminating signal reflections back to the cable 17.

A high-pass/low-pass diplexer filter may be designed to exhibit a constant resistance at its input port and to split input signals into two separate output loads in accordance with whether the signal frequency is in the high pass band or the low pass band. Such filter circuits are particularly adapted for solving second order intermodulation problems since one of the two interfering channel frequencies for most of the sum or difference second order intermodulation products is located in the other half of the frequency band and will thus be attenuated. To a lesser degree, third order intermodulation is also improved with such filters because a larger portion of the third order intermodulation producing channels are also attenuated.

The other circuit used in the constant impedance bandswitched input filter 11 of the invention is a constant resistance bridge T bandpass filter. The input impedance of a bridge T bandpass filter exhibits a constant resistance independent of frequency when the product of the reactive components of its series and parallel branches is equal to the square of its terminating input and output characteristic impedances. The constant bridge T bandpass filter is very effective in improving the third order and triple beat intermodulation rejection for the worst case channel which is in the midband where distortion contributing channels are located evenly on both sides of the received channel.

According to the present invention, by combining a constant resistance high-pass/low-pass diplexer filter with a constant resistance bridge T bandpass filter in which the input and output impedance of all three constituent stages are matched to the cable impedance, both second and third order intermodulation distortions are significantly reduced while a high return loss is provided which, in turn, reduces signal reflections. Also, the lowpass filter of the diplexer circuit reduces the back talk by attenuating the back talk-producing channel frequency which is located at the high end of the frequency band.

Referring again to FIG. 1, the configuration and operation of a preferred embodiment of the constant impedance bandswitched input filter 11 will now be described in detail. A received signal is provided via a cable 17 to an input terminal 24 and is coupled by means of AC coupling capacitor 26 to the bandswitched input filter 11 of the present invention which includes a low pass filter 12, a high pass filter 14 and a bandpass filter 16. The low pass filter 12 in combination with the high pass filter 14 forms a constant impedance complementary diplexer filter, while the bandpass filter 16 is a constant impedance bandpass filter, all matched to the impedance of cable 17 (typically 75 ohms). Each of a plurality of switching diodes used to provide the received signal to the various aforementioned filter stages of the bandswitched input filter 11 of the present invention, as described in detail below, is responsive to a respective bandswitch signal generated by a bandswitch selector 22. The various bandswitch signals output from the bandswitch selector 22 in response to operator inputs are represented as output voltages V1 through V4, with each of the bandswitch signals being either high or low in accordance with the desired routing of the received signal provided to input terminal 24. The output of the constant impedance bandswitched input filter 11 is provided via an AC coupling capacitor 72 to a wideband RF amplifier 18 which, in turn, provides an amplified output signal to a frequency converter 20. The bandswitch selector 22, the details of which may be conventional in nature and thus do not form a part of the present invention, also provides a reference frequency input to the frequency converter 20 which is used, in combination with the carrier frequency input signal from the RF amplifier 18, to generate an IF signal for recovering the video and audio information modulated on the carrier of the received signal provided to input terminal 24. The RF amplifier 18 as well as the frequency converter 20 contemplated for use in the front end of the multichannel communications receiver 10 may also be conventional in design and operation and thus the details thereof do not form a part of the present invention.

The low pass filter 12 in the bandswitched input filter 11 of the present invention is designed to transmit frequencies below approximately 290 MHz. The high pass filter 14 is designed to transmit signals having a frequency above approximately 310 MHz. The bandpass filter 16 utilized in the bandswitched input filter 11 of the present invention is centered at the crossover point between the low and high pass filters at about 300 MHz. The various bandswitch outputs from the tuning and bandswitch selector 22 provided to the switching diodes in the bandswitched input filter 11 actuate either the low pass filter 12, the high pass filter 14, or the bandpass filter 16 in accordance with the channel selected. A detailed description of the configuration and operation of the constant impedance bandswitched input filter 11 of the present invention is provided in the following paragraphs and includes Table I which indicates the state of the various switching diodes and outputs from the bandswitch selector 22 for switching to the several frequency bands in accordance with the present invention.

TABLE I

|  | V1 | V2 | V3 | V4 | D34 | D102 | D70 | D118 | D58 | D52 | D98 | D90 |
|---|---|---|---|---|---|---|---|---|---|---|---|---|
| BAND 1 (Low Pass) | Hi | Lo | Hi | Lo | 1 | 0 | 1 | 0 | 1 | 0 | 0 | 1 |
| BAND 2 (Cross-over) | Lo | Hi | ∅ | ∅ | 0 | 1 | 0 | 1 | ∅ | ∅ | ∅ | ∅ |
| BAND 3 (High Pass) | Hi | Lo | Lo | Hi | 1 | 0 | 1 | 0 | 0 | 1 | 1 | 0 |

Hi: Positive Voltage
Lo: Lower Voltage
1: ON
0: OFF
∅: Either ON or OFF

Upon selection of a signal frequency below approximately 290 MHz representing a first mode of operation, the bandswitch selector 22 outputs high V1 and V3 signals and low V2 and V4 signals. This ensures that the received signal is provided to the low pass filter 12 and prevents its transmission by either the high pass filter 14 or the bandpass filter 16 in the following manner. A high V1 output is provided via line 28 to point A and thence, via serially coupled resistor 30 and RF choke 32 to the anode of diode 34 which is thereby biased ON. This directs the signal transmitted on cable 17 and provided to the input terminal 24 via the AC coupling capacitor 26 to the low pass filter 12 and the high pass filter 14. The grounded serial combination of RF choke 35 and resistor 37 appears as an open circuit to RF signals, while serving to ground the non-RF portion of the received signal. The RF-wise open circuit presented by RF choke 35 and resistor 37 minimizes received signal loss. Similarly, the serial combination of RF choke 32 and resistor 30 coupled between diode 34 and point A ensures that the entire RF portion of the received signal provided to the input terminal 24 is transmitted to the low pass filter 12 and high pass filter 14. With a high V3 output from the bandswitch selector 22, diode 58 in the low pass filter 12 is biased ON. Similarly, a low V2 output from the bandswitch selector 22 ensures that diodes 102 and 118 are biased OFF in preventing the received signal from being coupled through the bandpass filter 16. In addition, a low V4 output from the bandswitch selector 22 biases diode 52 OFF allowing signals provided to the low pass filter 12 to be coupled therethrough. The low V4 output also biases diode 98 OFF preventing received signals from being coupled through the high pass filter 14. Finally, the high V1 output from the bandswitch selector 22 provided to point A biases diode 70 ON permitting the output of the low pass filter 12 to be provided via AC coupling capacitor 72 to the RF amplifier 18. The series combination of grounded RF choke 120 and resistor 122 appears as an open circuit to RF signals at the output of the bandswitched input filter 11, while directing non-RF signals to neutral ground potential.

The low pass filter 12 is comprised of a plurality of serially coupled inductors 36, 40, 44 and 48 in circuit with a plurality of grounded capacitors 38, 42 and 46. With diode 52 biased OFF by a low V4 output from the bandswitch selector 22 and diode 58 biased ON by a high V3 output from the bandswitch selector 22, the filtered output from the low pass filter 12 is provided via AC coupling capacitor 64, diode 70, and AC coupling capacitor 72 to the RF amplifier 18. The high V3 output from the bandswitch selector 22 also biases diode 90 ON for directing signals with the high pass filter 14 to ground via a terminating load resistor 88 and capacitor 92, the resistance of resistor 88 being equal to the characteristic impedance of cable 17. It should be noted here that the serial combinations of RF coil 62 and resistor 60 and RF coil 68 and resistor 66 minimize RF signal losses at the output of the low pass filter 12 by providing RF isolation for the output line. It is in this manner that a received signal provided to the input terminal 24 is provided to and filtered by the low pass filter 12 which, in turn, provides a low pass filtered output signal to the RF amplifier 18.

In a second mode of operation, the bandswitch selector 22, in response to operator inputs, generates a low V1 output and a high V2 output for providing the received signal from the input terminal 24 to the bandpass filter 16. The low V1 output from the bandswitch selector 22 biases diode 34 OFF and prevents the received signal from being provided from the input terminal 24 to either the low pass filter 12 or the high pass filter 14. A high V2 output from the bandswitch selector 22 provided to point B in the bandpass filter 16 biases diode 102 ON such that the received signal is provided from the input terminal 24 to the bandpass filter 16. A high V2 output from the bandswitch selector 22 also biases diode 118 ON. With the received signal prevented from being provided to either the low pass filter 12 or the high pass filter 14, the status of the V3 and V4 outputs of the band switch selector 22 is irrelevant in terms of the processing of the received signal. Thus, in the second mode of operation, the V3 and V4 outputs of the bandswitch selector 22 may be either high or low and the various diodes responsive to the V3 and V4 outputs may be either conducting or nonconducting.

The bandpass filter 16 includes a parallel arrangement of serially coupled inductor 104 and capacitor 106 and serially coupled resistors 108 and 110, the latter resistors each having a resistance equal to the characteristic impedance of the cable. The combination of inductor 104 and capacitor 106 forms a series tuned circuit tuned to the crossover frequency which, in a preferred embodiment of the present invention, is approximately 300 Hz. A parallel tuned circuit comprised of an inductor 112 and a grounded capacitor 116 has a frequency response complementary to that of the series tuned circuit. For frequencies near the crossover frequency, the series tuned circuit acts as a short circuit for coupling the RF signal provided to the bandpass filter 16 to RF amplifier 18 via diode 118, while the parallel tuned circuit acts as an open circuit. At frequencies far from the crossover frequency, the parallel tuned circuit acts as a short circuit to direct the signal provided to the bandpass filter 16 to neutral ground potential with resistors 108 and 110 effectively terminating the input and output of the bandpass filter 16, while the series tuned circuit acts as an open circuit. Grounded capacitor 114 provides DC isolation for point B to which the V2 DC output from the bandswitch selector 22 is provided.

In a third mode of operation, the bandswitch selector 22 provides high V1 and V4 outputs and low V2 and V3 outputs to the constant impedance bandswitched input filter 11 for providing higher frequency signals, e.g., signals having a frequency greater than approximately 310 MHz in a preferred embodiment, from the input terminal 24 to the RF amplifier 18 via the high pass filter 14. A low V2 output from the bandswitch selector 22 biases diodes 102 and 118 OFF and prevents the received RF signal from being coupled through the bandpass filter 16. Similarly, a low V3 output from the bandswitch selector 22 biases diode 58 OFF so as to prevent the low pass filter 12 from providing a signal to the wideband RF amplifier 18 and biases diode 90 OFF for preventing the grounding of signals carried within high pass filter 14. A high V1 output from the bandswitch selector 22 biases diodes 34 and 70 ON as in the first mode of operation discussed above. However, a high V4 output from the bandswitch selector 22 biases diode 52 ON in directing a signal provided to the low pass filter 12 to ground via terminating load resistor 50 and AC coupling capacitor 54, resistor 50 having a resistance equal to the characteristic impedance of cable 17. This prevents an RF signal carried by the low pass filter 12 from being output via diode 70 to the RF amplifier 18. The high V4 output from the bandswitch selector 22 also biases diode 98 ON permitting an RF signal provided to the high pass filter 14 to be provided via AC coupling capacitor 100 and diode 70 to the RF amplifier 18.

The high pass filter 14 is comprised of a plurality of serially coupled capacitors 74, 78, 82 and 86 and grounded inductors 76, 80 and 84. The grounded serial combination of resistor 94 and RF choke 96 appears as an open circuit to RF signals in the high pass filter 14, while grounding non-RF signals. Also, RF choke 96 serves to isolate resistor 94 from neutral ground in reducing RF losses to ground.

Referring to FIG. 2, there is shown the frequency selectivity characteristic of the constant impedance bandswitched input filter 11 of the present invention, in which the vertical axis represents the attenuation ratio in dB's and the horizontal axis represents the frequency in MHz. From the figure, it can be seen that at lower and higher frequencies, i.e., below about 250 MHz (band 1 operation) and above about 350 MHz (band 3 operation), the signal attenuation is minimal in the constant impedance bandswitched input filter. For example, signal losses in these frequency ranges are less than 0.5 dB. Because the input filter of the present invention provides impedance matching over the entire frequency band, including the rejection band, signal reflections within the cable are minimized. In prior art diplexer input filters insertion loss at the crossover frequency, i.e., 300 MHz, has been on the order of 3 dB. However, it can be seen from the figure that in the present invention by switching the bandpass filter 16 in circuit for the second band of operation, insertion loss is reduced from 3 dB to less than 0.5 dB. This reduced insertion loss at the cross-over frequency is due to the constant impedance bridge T bandpass filter. The overall constant impedance of the circuit reduces the standing wave ratio within the cable of the CATV system arising from impedance mismatch-generated signal reflections.

There has thus been shown a constant impedance bandswitched input filter for use in the front end of a wideband, multi-channel RF receiver which is particularly adapted for use in a CATV converter. The constant impedance bandswitched input filter of the present invention minimizes signal reflections at the input of the RF receiver by automatically switching in circuit either a lowpass filter, a highpass filter, or a bandpass filter in accordance with the frequency selected and providing a constant impedance over the passband as well as the rejection band.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A constant impedance input filter for coupling channel frequencies received over a cable from an input terminal to an output terminal, comprising:

constant resistance low pass diplexer filter means operable for processing received channels within a low frequency band, said low pass filter means having a fixed upper cut-off frequency for passing only signals having a frequency below said fixed upper cut-off frequency and for directing to neutral ground potential signals having a frequency above said fixed upper cut-off frequency;

constant resistance high pass diplexer filter means operable for processing received channels within a high frequency band, said high pass filter means having a fixed lower cut-off frequency for passing only signals having a frequency above said fixed lower cut-off frequency and for directing to neutral ground potential signals having a frequency below said fixed lower cut-off frequency wherein said upper cut-off frequency is less than said lower cut-off frequency so as to define a crossover frequency range therebetween;

constant resistance bridge T bandpass filter means operable for processing received channels within a band intermediate said upper and lower cut-off frequencies and within said crossover frequency range and for directing to neutral ground potential signals having a frequency below said upper cut-off frequency or above said lower cut-off frequency, wherein said high and low pass filter means and said bandpass filter means each have an input impedance equal to the characteristic impedance of the cable;

selector means responsive to a user input in selecting a channel for generating a bandswitch signal; and switching means coupled to the input terminal, to said high and low pass filter means, to said bandpass filter means and to said selector means and responsive to a bandswitch signal from the selector means for selectively operataing either said high pass filter means, said low pass filter means or said bandpass filter means for coupling a received channel from said input terminal to said output terminal in accordance with a selected channel while providing a substantially constant impedance across the entire received signal bandwidth.

2. A constant impedance input filter according to claim 1 wherein said bandswitch signal includes a plurality of control voltages output from said selector means and wherein said switching means includes a plurality of switching diodes each responsive to a respective one of said control voltages for selectively actuating and coupling said high pass filter means, said low pass filter means or said bandpass filter means between said input and output terminals in accordance with a selected channel.

3. A constant impedance input filter according to claim 2 wherein said switching means includes a first switching diode coupled to said high and low pass filter means and to the input terminal and responsive to a first control voltage from said selector means, a second switching diode coupled to said bandpass filter means and to the input terminal and responsive to a second control voltage from said selector means, and third and fourth switching diodes respectively coupled to said low pass filter means and said high pass filter means and respectively responsive to third and fourth control voltages from said selector means for actuating a respective filter means.

4. A constant impedance input filter according to claim 3 wherein said switching means further includes fifth and sixth switching diodes respectively coupled to the combination of said low and high pass filter means and to said bandpass filter means and further coupled to an output terminal, said fifth and sixth switching diodes responsive to respective fifth and sixth control voltages from said selector means for coupling a respective filter means to said output terminal.

5. A constant impedance input filter according to claim 4 wherein said output terminal is coupled to a wideband RF amplifier.

6. A constant impedance input filter according to claim 1 wherein said high and low pass filter means comprise, in combination, a constant impedance complementary diplexer filter.

7. A constant impedance input filter according to claim 1 wherein said bandpass filter means includes series circuit means having a bandpass response corresponding to said crossover frequency range and a grounded parallel tuned circuit means coupled to said series circuit means and having a frequency response characteristic complementary to said bandpass response.

8. A constant impedance input filter according to claim 1 wherein the center of said crossover frequency range is on the order of 300 MHz.

9. A constant impedance input filter according to claim 8 wherein said crossover frequency range extends from approximately 290 MHz to approximately 310 MHz.

* * * * *